(12) United States Patent
Thiyagarajan et al.

(10) Patent No.: US 7,923,200 B2
(45) Date of Patent: *Apr. 12, 2011

(54) COMPOSITION FOR COATING OVER A PHOTORESIST PATTERN COMPRISING A LACTAM

(75) Inventors: Muthiah Thiyagarajan, Bridgewater, NJ (US); Ralph R. Dammel, Flemington, NJ (US); Yi Cao, Bedminster, NJ (US); SungEun Hong, Bedminster, NJ (US); WenBing Kang, Kakegawa (JP); Clement Anyadiegwu, Parlin, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 453 days.

This patent is subject to a terminal disclaimer.

(21) Appl. No.: 11/697,804

(22) Filed: Apr. 9, 2007

(65) Prior Publication Data
US 2008/0248427 A1 Oct. 9, 2008

(51) Int. Cl.
*G03F 7/40* (2006.01)
(52) U.S. Cl. ............ 430/313; 430/14; 430/330; 430/331
(58) Field of Classification Search .................... 430/14, 430/313, 330, 331; 526/264
See application file for complete search history.

(56) References Cited

U.S. PATENT DOCUMENTS

| | | | |
|---|---|---|---|
| 3,104,205 A | 9/1963 | Hainer et al. | |
| 3,666,473 A | 5/1972 | Colom et al. | |
| 4,521,404 A * | 6/1985 | Lorenz et al. | 424/70.15 |
| 4,595,737 A * | 6/1986 | Straub et al. | 526/264 |
| 4,812,551 A | 3/1989 | Oi et al. | |
| 4,823,345 A | 4/1989 | Daniel et al. | |
| 5,035,881 A | 7/1991 | Mori et al. | |
| 5,073,233 A | 12/1991 | Banks et al. | |
| 5,294,444 A | 3/1994 | Nakamura et al. | |
| 5,538,820 A | 7/1996 | Fisher | |
| 5,547,812 A | 8/1996 | Collins et al. | |
| 5,585,219 A | 12/1996 | Kaimoto et al. | |
| 5,626,836 A * | 5/1997 | Liu et al. | 424/47 |
| 5,750,680 A | 5/1998 | Kim et al. | |
| 5,820,491 A | 10/1998 | Hatch et al. | |
| 5,830,964 A * | 11/1998 | Liu et al. | 526/264 |
| 5,843,624 A | 12/1998 | Houlihan et al. | |
| 5,858,620 A | 1/1999 | Ishibashi et al. | |
| 5,863,707 A | 1/1999 | Lin et al. | |
| 5,955,606 A | 9/1999 | Kim et al. | |
| 5,994,022 A * | 11/1999 | Tanabe et al. | 430/170 |
| 6,051,678 A | 4/2000 | Kim et al. | |
| 6,080,707 A | 6/2000 | Glenn et al. | |
| 6,090,772 A | 7/2000 | Kaiser et al. | |
| 6,136,499 A | 10/2000 | Goodall et al. | |
| 6,147,249 A | 11/2000 | Watanabe et al. | |
| 6,180,244 B1 | 1/2001 | Rayner et al. | |
| 6,262,222 B1 | 7/2001 | Kim et al. | |
| 6,274,286 B1 | 8/2001 | Hatakeyama et al. | |
| 6,319,853 B1 | 11/2001 | Ishibashi et al. | |
| 6,365,322 B1 | 4/2002 | Padmanaban et al. | |
| 6,376,157 B1 | 4/2002 | Tanaka et al. | |
| 6,447,980 B1 | 9/2002 | Rahman et al. | |
| 6,555,607 B1 | 4/2003 | Kanda et al. | |
| 6,579,657 B1 | 6/2003 | Ishibashi et al. | |
| 6,727,034 B1 | 4/2004 | Ogiso et al. | |
| 688,258 A1 | 11/2004 | Kaneko et al. | |
| 6,811,817 B2 | 11/2004 | Sugeta et al. | |
| 6,864,035 B2 | 3/2005 | Imai | |
| 6,916,590 B2 | 7/2005 | Kaneko et al. | |
| 7,141,177 B2 | 11/2006 | Tanaka | |
| 7,189,499 B2 * | 3/2007 | Sugeta et al. | 430/324 |
| 7,226,726 B2 | 6/2007 | Kanda | |
| 7,252,783 B2 | 8/2007 | Weir et al. | |
| 7,314,691 B2 * | 1/2008 | Hata et al. | 430/14 |
| 7,335,464 B2 | 2/2008 | Takano et al. | |
| 7,399,582 B2 | 7/2008 | Takahashi et al. | |
| 7,595,141 B2 | 9/2009 | Kudo et al. | |
| 7,598,320 B2 | 10/2009 | Nishikawa et al. | |

(Continued)

FOREIGN PATENT DOCUMENTS

EP 1 223 470 A1 7/2002

(Continued)

OTHER PUBLICATIONS

English Language Abstract of JP 1-221750 A.
English Language Abstract of JP 3-200805 A.
English Language Abstract of JP 5-241348 A.
English Language Abstract of JP 6-250379 A.
English Language Abstract of JP 6-81173 A.
English Language Abstract of JP 9-235318 A.

(Continued)

*Primary Examiner* — John S Chu
(74) *Attorney, Agent, or Firm* — Sangya Jain

(57) ABSTRACT

The present invention relates to an aqueous coating composition for coating a photoresist pattern comprising a polymer containing a lactam group of structure (1)

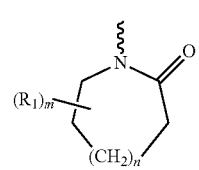

(1)

where $R_1$ is independently selected hydrogen, $C_1$-$C_4$ alkyl, $C_1$-$C_6$ alkyl alcohol, hydroxy (OH), amine ($NH_2$), carboxylic acid, and amide ($CONH_2$), ∿∿ represents the attachment to the polymer, m=1-6, and n=1-4.

The present invention also relates to a process for manufacturing a microelectronic device comprising providing a substrate with a photoresist pattern, coating the photoresist pattern with the novel coating material reacting a portion of the coating material in contact with the photoresist pattern, and removing a portion of the coating material which is not reacted with a removal solution.

16 Claims, 1 Drawing Sheet

U.S. PATENT DOCUMENTS

| | | | |
|---|---|---|---|
| 7,745,077 | B2 | 6/2010 | Thiyagarajan et al. |
| 2001/0044070 | A1 | 11/2001 | Uetani et al. |
| 2002/0192591 | A1 | 12/2002 | Komatsu et al. |
| 2003/0008968 | A1* | 1/2003 | Sugeta et al. ............... 524/556 |
| 2003/0091732 | A1 | 5/2003 | Kanda |
| 2003/0102285 | A1 | 6/2003 | Nozaki et al. |
| 2003/0129538 | A1 | 7/2003 | Sheu et al. |
| 2003/0143490 | A1 | 7/2003 | Kozawa et al. |
| 2003/0143491 | A1 | 7/2003 | Lu et al. |
| 2004/0109958 | A1 | 6/2004 | Nigam et al. |
| 2004/0110099 | A1 | 6/2004 | Kozawa et al. |
| 2004/0121259 | A1 | 6/2004 | Kozawa et al. |
| 2005/0123851 | A1 | 6/2005 | Shinbori et al. |
| 2005/0175926 | A1 | 8/2005 | Sugeta et al. |
| 2005/0227151 | A1 | 10/2005 | Hata et al. |
| 2005/0245663 | A1 | 11/2005 | Sugeta et al. |
| 2006/0073419 | A1 | 4/2006 | Kozawa et al. |
| 2006/0088788 | A1 | 4/2006 | Kudo et al. |
| 2006/0099347 | A1 | 5/2006 | Sugeta et al. |
| 2006/0160015 | A1 | 7/2006 | Takano et al. |
| 2006/0183218 | A1 | 8/2006 | Takahashi et al. |
| 2006/0211814 | A1 | 9/2006 | Mishikawa et al. |
| 2006/0258809 | A1 | 11/2006 | Sugeta et al. |
| 2007/0003870 | A1* | 1/2007 | Van Aert et al. ............ 430/270.1 |
| 2007/0059644 | A1 | 3/2007 | Takahashi et al. |
| 2007/0212640 | A1* | 9/2007 | Sato et al. .................. 430/270.1 |
| 2007/0213447 | A1 | 9/2007 | Sugeta et al. |
| 2007/0259106 | A1 | 11/2007 | Shimizu et al. |
| 2008/0044759 | A1 | 2/2008 | Ishibashi et al. |
| 2008/0193880 | A1 | 8/2008 | Nishibe et al. |
| 2009/0317739 | A1 | 12/2009 | Thiyagarajan et al. |
| 2010/0119717 | A1 | 5/2010 | Hong et al. |

FOREIGN PATENT DOCUMENTS

| | | |
|---|---|---|
| EP | 1 602 983 A1 | 7/2005 |
| EP | 1 757 989 A1 | 2/2007 |
| GB | 2 305 175 A | 4/1997 |
| GB | 2 320 500 A | 6/1998 |
| JP | 36-22145 | 11/1961 |
| JP | 1-221750 A | 9/1989 |
| JP | 3-200805 A | 9/1991 |
| JP | 5-241348 A | 9/1993 |
| JP | 6-81173 A | 3/1994 |
| JP | 6-250379 A | 9/1994 |
| JP | 7-191214 A | 7/1995 |
| JP | 9-235318 A | 9/1997 |
| JP | 9-244262 A | 9/1997 |
| JP | 9-325502 A | 12/1997 |
| JP | 10-73927 A | 3/1998 |
| JP | 5-166717 A | 11/2009 |
| WO | WO 98/14832 A1 | 4/1998 |
| WO | WO 00/17712 A1 | 3/2000 |
| WO | WO 00/67072 A1 | 11/2000 |
| WO | WO 2006/019135 A1 | 2/2006 |
| WO | WO 02/48260 A2 | 6/2006 |
| WO | WO 2007/013230 A1 | 2/2007 |
| WO | WO 2009/091361 A1 | 7/2009 |

OTHER PUBLICATIONS

English Language Abstract of JP 9-244262 A.
English Language Abstract of JP 9-325502 A.
Complete set of specification papers for U.S. Appl. No. 10/089,704, filed Oct. 4, 2000 with cover page.
English Language Translation of Claim for JP 36-22145.
International Search Report (Form PCT/ISA/210) for PCT/JP00/06940.
Notification of Transmittal of the International Search Report and the Written Opinion of the International Searching Authority, or the Declaration (Form PCT/ISA/220); International Report (Form PCT/ISA/210); and Written Opinion of the International Searching Authority (Form PCT/ISA/237) for PCT/IB2006/003347.
Substantive/Modified Substantive Examination and Search Report (in English) for Malaysian patent application No. PI 20013263.
English Translation (and original language document) of Pre-Notification of Reasons for Possible Rejection of the Pending Patent Examination dated Mar. 19, 2004; of Decision on Examination dated May 20, 2004; and of Pre-Notification of Reasons for Possible Rejection of the Pending Patent Re-Examination dated Nov. 3, 2005 for Taiwanese patent application No. 90111701.
English language translation (and original language document) of Notice of the First Office Action dated Apr. 1, 2005 and of Notice of the Second Office Action dated Mar. 24, 2006 for Chinese patent application No. 01802203.0.
Official Action (in Chinese and English Translation thereof) from State Intellectual Property Office of P.R. China for Application No. 02817955.2.
W.E. Feely, J.C. Imhof and C.M. Stein, Polymer Engineering and Science, vol. 26, No. 16, pp. 1101-1104 (Mid-Sep. 1983).
H. Ito and C.G. Wilson, Polymer Engineering and Science, vol. 23, No. 18. pp. 1012-1018 (Dec. 1983).
Kodama et al., "Synthesis of Novel Fluoropolymer for 157nm Photoresists by Cyclo-polymerization", Proc. SPIE vol. 5690, p. 76-pp. 83 (2002).
Mori, CAPLUS AN1994:617650.
Skofronick et al CAPLUS AN 1969:492865.
Tran et al., "Metal-Catalized Vinyl Addition Polymers for 157 nm Resist Applications. 2. Fluorinated Norbornenes: Synthesis, Polymerization, and Initial Imaging Results", Macromolecules vol. 35, pp. 6539-pp. 6549 (2002).
Notification of Transmittal of the International Search Report and the Written Opinion of the International Searching Authority, or the Declaration (Form PCT/ISA/220), Searching Authority, or the Declaration (Form PCT/ISA/220), and Written Opinion of the International Searching Authority (Form PCT/ISA/237) for PCT/IB2008/000908 dated Jun. 19, 2009, which corresponds to this patent application.
U.S. Appl. No. 12/451,150, filed Oct. 27, 2009, Sung-Eun Hong et al.
Form PCT/ISA/220, Form PCT/ISA/210, and Form PCT/ISA/237 for PCT/IB2009/005975 dated Sep. 22, 2009, which corresponds to U.S. Appl. No. 12/141,307.
Machine Language English Abstract and Translation from JPO of JP 2008-255124 A, which is equivalent of WO 2007/013230 A1.
English Language Abstract of WO 2007/013230 A1 from Database CAPLUS entered Feb. 1, 2007, Chemical Abstracts Service, AN 2007:114002 (XP-002545404).
International Search Report (Form PCT/ISA/210) for PCT/JP2008/058341 dated Nov. 13, 2008, which corresponds to U.S. Appl. No. 12/451,150.
Form PCT/IB/326, FormPCT/IB/373, and Form PCT/ISA/237 for PCT/IB2008/000908 dated Oct. 22, 2009, which corresponds to U.S. Appl. No. 11/697,804.
Form PCT/IB/373 Form PCT/ISA/237, and English translation thereof, for PCT/JP2008/058341 issued Nov. 3, 2009, which corresponds to U.S. Appl. No. 12/451,150.
Office Action dated Dec. 24, 2008 for U.S. Appl. No. 12/141,307.
EPO Form 1226A dated Jan. 31, 2011 for EP 09 766 190.4, which corresponds to U.S. Appl. No. 12/141,307.
Form PCT/IB/326, Form PCT/IB/373, and Form PCT/ISA/237 date mailed Dec. 29, 2010 for PCT/IB2009/005975, which corresponds to U.S. Appl. No. 12/141,307.

* cited by examiner

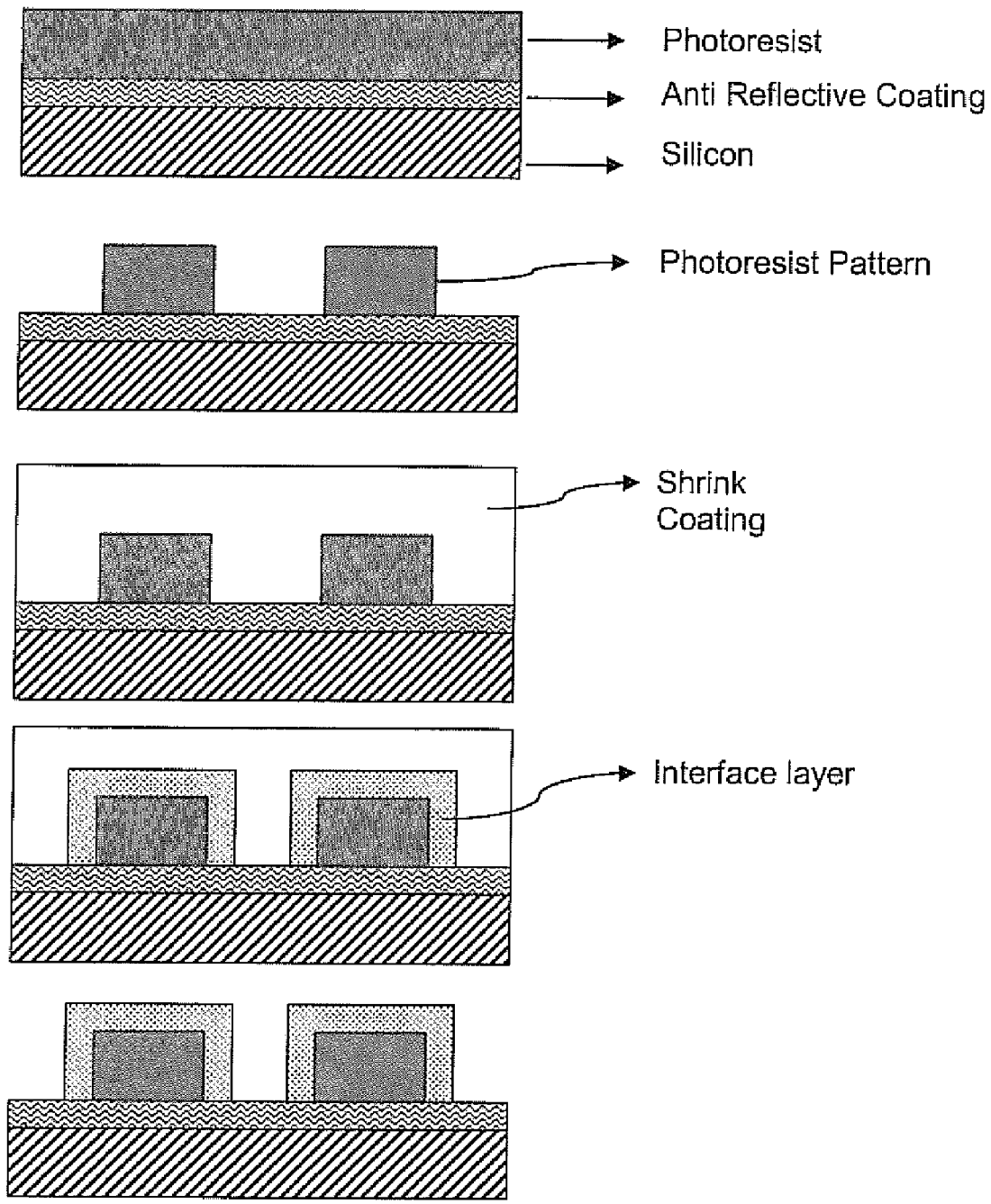
Figure 1 Illustration of the Shrink Process

COMPOSITION FOR COATING OVER A PHOTORESIST PATTERN COMPRISING A LACTAM

TECHNICAL FIELD

The present invention relates to a composition for coating over a photoresist pattern to improve lithographic performance and also relates to a process for using such a coating for making an image on a substrate.

BACKGROUND ART

The densification of integrated circuits in semiconductor technology has been accompanied by a need to manufacture very fine interconnections within these integrated circuits. Ultra-fine patterns are typically created by forming patterns in a photoresist coating using photolithographic techniques. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

Miniaturization of integrated circuits requires the printing of narrower and narrower dimensions within the photoresist. Various technologies have been developed to shrink the dimensions to be printed by the photoresist, examples of such technologies are, multilevel coatings, antireflective coatings, phase-shift masks, photoresists which are sensitive at shorter and shorter wavelengths, etc.

One important process for printing smaller dimensions relies on the technique of forming a thin layer on top of the image of the photoresist, which widens the photoresist image and reduces the dimension of the space between adjacent photoresist patterns. This narrowed space can be used to etch and define the substrate or be used to deposit materials, such as metals. This bilevel technique allows much smaller dimensions to be defined as part of the manufacturing process for microelectronic devices, without the necessity of reformulating new photoresist chemistries. The top coating layer or shrink material may be an inorganic layer such as a dielectric material, or it may be organic such as a crosslinkable polymeric material.

Dielectric shrink materials are described in U.S. Pat. No. 5,863,707, and comprise silicon oxide, silicon nitride, silicon oxynitride, spin on material or chemical vapor deposited material. Organic polymeric coatings are described in U.S. Pat. No. 5,858,620, where such coatings undergo a crosslinking reaction in the presence of an acid, thereby adhering to the photoresist surface, but are removed where the top shrink coating has not been crosslinked. U.S. Pat. No. 5,858,620 discloses a method of manufacturing a semiconductor device, where the substrate has a patterned photoresist which is coated with a top layer, the photoresist is then exposed to light and heated so that the photogenerated acid in the photoresist diffuses through the top layer and can then crosslink the top layer. The extent to which the acid diffuses through the top coat determines the thickness of the crosslinked layer. The portion of the top layer that is not crosslinked is removed using a solution that can dissolve the polymer.

The present invention relates to a coating composition of a shrink coating material comprising a polymer comprising lactam groups. A polymer which is water soluble and comprises a lactam group is particularly useful for coating over photoresists sensitive at 248 nm, 193 nm and 157 nm, where the photoresist polymer comprises groups that can react with the lactam. The object of the invention is to form a coating over the imaged photoresist pattern which reacts with the photoresist and stabilizes the photoresist pattern and further increases the dimensional thickness of the photoresist such that narrow spaces can be defined. It has been unexpectedly found that the use of this novel coating shrink composition leads to improved pattern definition, higher resolution, low defects, less temperature sensitivity and stable pattern formation of imaged photoresist.

BRIEF DESCRIPTION OF DRAWING

FIG. 1 illustrates the imaging process using the shrink material.

SUMMARY OF THE INVENTION

The invention relates to an aqueous coating composition for coating a photoresist pattern, comprising a water soluble polymer comprising at least one lactam group, where the lactam group attached to the polymer has a structure (1)

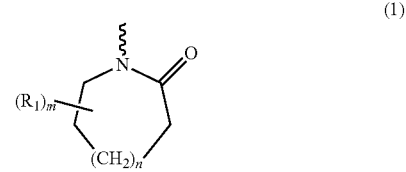

where $R_1$ is independently selected from hydrogen, $C_1$-$C_4$ alkyl, $C_1$-$C_6$ alkyl alcohol, hydroxy (OH), amine ($NH_2$), carboxylic acid, and amide ($CONH_2$), ∿∿ represents the attachment to the polymer, m=1-6, and n=1-4.

The invention also relates to an aqueous composition where the polymer containing the lactam group comprises the monomeric unit of structure (2),

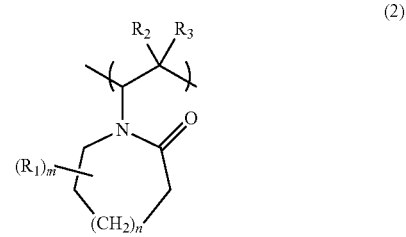

where $R_1$ is independently selected from hydrogen, $C_1$-$C_4$ alkyl, $C_1$-$C_6$ alkyl alcohol, hydroxy (OH), amine ($NH_2$), carboxylic acid, and amide ($CONH_2$), $R_2$ and $R_3$ are independently selected from hydrogen, $C_1$-$C_6$ alkyl, m=1-6, and n=1-4.

The invention further relates to a process for manufacturing an electronic device comprising forming a layer of the shrink coating material comprising a lactam group on top of an imaged photoresist pattern, reacting a portion of the shrink material near the photoresist interface, and removing the unreacted, soluble portion of the shrink material with a removal solution.

DESCRIPTION OF THE INVENTION

The present invention relates to an aqueous shrink coating composition comprising a polymer containing at least one lactam group. The invention also relates to a process for manufacturing a microelectronic device for reducing the critical dimensions of the patterned photoresist substrate, comprising forming a layer of shrink coating material on top of an imaged photoresist pattern, reacting a portion of the shrink material near the photoresist interface, and removing the unreacted, soluble portion of the shrink material with a removal solution.

FIG. 1 illustrates the process for using the shrink material to reduce the spaces between the photoresist patterns, where the photoresist is coated over an antireflective coating, imaged, and then coated with the shrink material composition. The substrate is heated to form an interface layer. The unreacted shrink layer is removed to form a photoresist/interface layer pattern with a narrower space than with the photoresist alone.

The aqueous shrink coating composition for coating a photoresist pattern, comprises a water soluble polymer or essentially a water soluble polymer containing a lactam group, where the lactam group is attached to the polymer and has the structure (1),

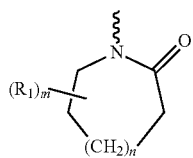

where $R_1$ is independently selected from hydrogen, $C_1$-$C_4$ alkyl, $C_1$-$C_6$ alkyl alcohol, hydroxy (OH), amine ($NH_2$), carboxylic acid, and amide ($CONH_2$), ∼∼∼ represents the attachment to the polymer, m=1-6, and n=1-3.

The shrink material of the present invention comprises a water soluble or essentially water soluble homopolymer or copolymer containing a lactam group, where the lactam group is attached to the polymer having structure (1). The polymer when referred to as water soluble is meant to encompass where the polymer is essentially water soluble. The composition comprises water but may include other water miscible solvent or solvents which further enhance the solubility of the polymer or other additives in the composition. The polymer may contain other functional groups which make the polymer water soluble, such as pyrrolidone, imidazole, $C_1$-$C_6$ alkyl amine, $C_1$-$C_6$ alkyl alcohol, carboxylic acid and amide. Other types of comonomeric units may also be present in the polymers.

The water soluble polymer of the shrink coating material may comprise at least one unit of structure (2), where the lactam group of structure (1) is derived from a vinyl monomer,

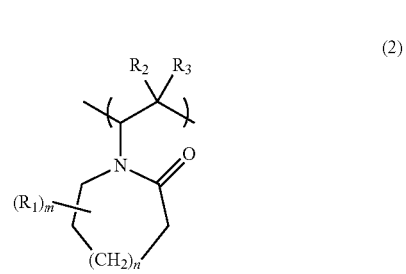

where $R_1$ is independently selected from hydrogen, $C_1$-$C_4$ alkyl, $C_1$-$C_6$ alkyl alcohol, hydroxy (OH), amine ($NH_2$), carboxylic acid, and amide ($CONH_2$), $R_2$ and $R_3$ are independently selected from hydrogen, $C_1$-$C_6$ alkyl, m=1-6, and n=1-4. Alkyl generally refers to linear and branched alkyls, and cyclic alkyls.

The polymer comprising structure (2) may be synthesized from any suitable vinyl monomers containing the lactam group. Specific examples of the monomers which are used to derive the unit of structure (2) are N-vinyllactams, more specifically, N-vinyl-2 piperidone, N-vinyl-4-methyl-2-piperidone, N-vinyl-4-ethyl-2-piperidone, N-vinyl-4-propyl-2-piperidone, N-vinyl-2-caprolactam, N-vinyl-4-methyl-2-caprolactam, N-vinyl-4-ethyl-2-caprolactam, N-vinyl-4-propyl-2-caprolactam, N-vinyl-4-butyl-2-caprolactam, N-vinyl-6-methyl-2-caprolactam, N-vinyl-6-ethyl-2-caprolactam, N-vinyl-6-propyl-2-caprolactam, N-vinyl-6-butyl-2-caprolactam, and their equivalents. More than one type of vinyllactam may be used in the synthesis of the polymer. The N-vinyl lactams may be copolymerized with other vinyl monomers, such as exemplified without limitation by N-vinyl pyrrolidone, acrylic acid, vinyl alcohol, methacrylic acid, N-vinylimidazole, acrylamide, allylamine, vinyl triazines, 2-vinyl-4,6-diamino-1,3,5-triazine, diallylamine, vinylamine; a cationic monomer such as dimethylaminoethyl acrylate, dimethylaminoethyl methacrylate, dimethylaminopropylmethacrylate; N-acryloylmorpholine, piperidinyl methacrylate; and bifunctional monomers such as ethyleneglycoldiacrylate, and ethyleneglycoldimethacrylate.

Other types of polymers containing the lactam group of structure (1) may be also be used. One example is cellulosic polymers. Cellulosic derivatives may be reacted with a compound containing a cyclic lactam group to give the polymer comprising structure (1). Examples of polymers that can react are hydroxypropylmethyl cellulose phthalate, hydroxypropylmethylcellulose acetate phthalate, hydroxypropylmethylcellulose acetate succinate and hydroxyethyl cellulose. Other types of water soluble polymers comprising the lactam group may also be used, such as alkyleneglycol polymers reacted with a compound containing a cyclic lactam group, urea polymers reacted with a compound containing a cyclic lactam group, melamine polymers reacted with a compound containing a cyclic lactam group, epoxy polymers reacted with a compound containing a cyclic lactam group, and amine polymers reacted with a compound containing a cyclic lactam group.

In one embodiment of the water soluble polymer, the polymer is polymerized from a mixture of N-vinyl-2-caprolactam, N-vinyl pyrrolidone and N-vinylimidazole. In another embodiment the copolymers containing the lactam group are exemplified by poly(N-vinyl caprolactam-co-vinyl amine), poly(N-vinyl caprolactam-co-allyl amine), poly(N-vinyl caprolactam-co-diallyl amine), poly(N-vinyl caprolactam-co-acryloyl morpholine), poly(N-vinyl caprolactam-co-2-dimethylaminoethyl methacrylate), poly(N-vinyl caprolactam-co-piperidinyl methacrylate), poly(N-vinyl caprolactam-co-N-methyl N-vinylacetamide) and poly(N-vinyl caprolactam-co-dimethylaminopropyl methacrylamide).

The polymer comprising the lactam group in one embodiment is free of any aromatic moiety or absorbing chromophore. The polymer or the composition does not absorb the radiation used to image the photoresist which is coated beneath the shrink layer. The composition may be free of a photoacid generator such that the composition is not photo-imageable.

The water soluble polymer can be made by any polymerization technique. Bulk or solution polymerization may be used. Typically the vinyl monomers are polymerized using a polymerization initiator, such as azo or peroxide initiators. Examples of peroxide initiators are acetyl peroxide, benzoyl peroxide, lauryl peroxide, cumenehydroperoxide, etc. Examples of azo initiators are azobisisobutyronitrile (AIBN), 2,2'-diamidino-2,2'-azodipropane dihydrochloride, 2,2'-azobis[2-(2-imidazolin-2-yl)propane]dihydrochloride, 2,2'-azobis(2-amidino propane)dihydrochloride, 2,2'-azobis[2-(2-imidazolin-2-yl)propane]dihydrochloride and examples of persulfates are such as ammonium persulfates and potassium persulfates. The polymerization can be carried out in the presence of a solvent, examples of which are methanol, ethanol, isopropanol and water, preferably for some reactions, isopropanol. The reaction can be carried out for a suitable amount of time and at a suitable temperature. The reaction time can range from about 3 hrs to about 18 hrs. The reaction temperature can range from about 50° C. to about 70° C. The weight average molecular weight of the polymer for the shrink coating material ranges from approximately 3,000 to 100,000, preferably from Mw 5,000 to 100,000, and more preferably from 10,000 to 50,000, but any polymer with the appropriate molecular weight may be used.

The shrink coating material composition of the present invention comprises a water soluble polymer containing the lactam group and water, where the polymer concentration ranges from about 1 weight % to about 20 weight %, preferably 2-10 weight %, and more preferably 2-6 weight % of the composition, depending on the physical parameters of the polymer and the different chemical compositions of the polymer. Additives and/or other solvents that are miscible with water may be added to the composition, such as crosslinking agents, water soluble polymers other than those containing a lactam group, alcohols, aminoalcohols, amines, surfactants, thermal acid generators, free acids, photoacid generators. In the formulation of the shrink material, water miscible solvents can be used in order to get a uniform coating. The water miscible organic solvents used are exemplified by ($C_1$-$C_8$) alcohols such as methyl alcohol, ethyl alcohol, isopropyl alcohol, diols (such as glycols) and triols (such as glycerol); ketones such as acetone, methyl ethyl ketone, 2 heptanone, cyclohexanone; esters such as methyl acetate and ethyl acetate; lactates such as methyl lactate and ethyl lactate, lactones such as gamma-butyrolactone; amides such as N,N-dimethyl acetamide; ethylene glycol monoalkyl ethers such as ethylene glycol monomethyl ether, and ethylene glycol monoethyl ether; ethylene glycol monoalkyl ether acetate such as ethylene glycol monomethyl ether acetate, ethylene glycol monoethyl ether acetate; other solvents such as N-methylpyrolidone, propylene glycol monomethyl ether, propylene glycol monoethyl ether, propylene glycol monomethyl ether acetate, propylene glycol monoethyl ether acetate Solvents such as ($C_1$-$C_8$)alcohols, particularly, isopropanol, methyl alcohol, ethyl alcohol may be added. The solvent may be added to the composition at up to about 30 weight % or up to 20 weight % of the total composition.

Some additives which are added to the shrink material composition can be exemplified by aminoalcohols, such as monoethanolamine, diethanolamine, triethanolamine, 2-(2-aminoethoxy)ethanol, N,N-dimethylethanolamine, N,N-diethanolamine, N-methyldiethanolamine, monoisopropylamine, diisopropylamine and triisopropylamine; amines such as polyalkylenepolyamines, 2-ethylhexylamine, dioctylamine, tripropylamine, tributylamine, triallylamine; and cyclic amines such as piperazine, N-methylpiperazine and hydroxyethylpiperazine. Crosslinking agents such as any known crosslinker may be used, like glycolurils, melamines, urea/formaldehyde polymers, etc. In one embodiment, the coating composition does not contain a crosslinking agent, especially melamine and urea based crosslinking agents. Crosslinking agents are not necessary for the reaction between the polymer of the top coat and the photoresist polymer, since it is believed but not bound by theory, that the present invention involves a base induced reaction of the functionality in the photoresist polymer. Therefore, in one embodiment the shrink material composition is free of crosslinking agents. Other water soluble polymers may be added to the composition, such as polyvinyl alcohol, partially acetal capped polyvinyl alcohol, polyallylamine, polyacrylic acid, polymethacrylic acid, poly(vinylpyrrolidone-co-vinyl alcohol), poly(vinylpyrrolidone-co-vinyl melamine), etc. These polymers may be added at up to 30 weight %. Free acids such as p-toluenesulphonic acid, perfluorobutanesulphonic acid, perfluorooctanesulphonic acid, (±) camphorsulphonic acid and dodecylbenzenesulphonic acid may be added to the composition.

Any known thermal acid generators and photoacid generators that are water soluble may be used alone or as mixtures. Suitable examples of acid generating photosensitive compounds include, without limitation, ionic photoacid generators (PAG), such as diazonium salts, iodonium salts, sulfonium salts. The thermal acid generator (TAG) used in the present invention may be any that upon heating generates an acid which can cleave the acid cleavable bond present in the invention, particularly a strong acid such as a sulfonic acid. Preferably, the thermal acid generator is activated at 90° C. and more preferably at above 120° C., and even more preferably at above 150° C. The photoresist film is heated for a sufficient length of time to react with the coating.

The free acid, photoacid generator and/or the thermal acid generator, may be incorporated in a range from about 0.1 to about 10 weight % by total solids of the composition, preferably from 0.3 to 5 weight % by solids, and more preferably 0.5 to 2.5 weight % by solids.

An imaged pattern of photoresist is formed on a substrate according to processes well-known to those skilled in the art. Photoresists can be any of the types used in the semiconductor industry. There are two types of photoresist compositions, negative-working and positive-working. When negative-working photoresist compositions are exposed image-wise to radiation, the areas of the photoresist composition exposed to the radiation become insoluble to a developer solution while the unexposed areas of the photoresist coating remain relatively soluble to such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature which the photoresist composition can transfer from the photomask to the substrate with a high degree of image edge acuity after exposure and development. In addition, it is almost always desirable that the developed photoresist wall profiles be near vertical relative to the substrate. Such demarcations between developed and undeveloped areas of the photoresist coating translate into accurate pattern transfer of the mask image onto the substrate. This becomes even more critical as the push toward miniaturization reduces the critical dimensions on the devices.

Generally, a photoresist comprises a polymer and a photosensitive compound. Examples of photoresist systems, without limitation, are novolak/diazonaphthoquinone, polyhydroxystyrene/onium salts, capped polyhydroxystyrene/onium salts, cycloaliphatic polymers/onium salts, cycloaliphatic acrylate polymers/onium salts, and fluoropolymers/onium salts, etc. These photoresists are well-known for use at wavelengths ranging from 436 nm 1 to 30 nm. Any type of photoresist that is capable of forming an image may be used. Generally, a photoresist is coated on a substrate, and the photoresist coating is baked to remove substantially all of the coating solvent. The coating is then exposed with the appropriate wavelength of light, and developed with a suitable developer.

Suitable device substrates include, without limitation, silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group III/V compounds. The substrate may comprise any number of layers made from the materials described above. Generally one or more layers of an antireflective coating are coated over the device substrate and the photoresist is coated over the antireflective coating(s).

Once a photoresist pattern is defined on the substrate, the novel shrink material of the present invention, comprising a water soluble polymer containing the lactam group, is coated over the substrate with the photoresist pattern and reacted with the surface of the photoresist to form an interface layer which is insoluble in the aqueous removing solution. A rinsing solution can remove the shrink material that has not reacted to form the interface layer. The interface layer is formed by heating the substrate as a suitable temperature for a suitable time. The interface layer will increase the width of the photoresist pattern. Thus the space between two adjacent photoresist shapes will become smaller after the formation of the interface layer, and the space can be used to define smaller features than the photoresist alone. FIG. 1 illustrates the process.

The novel shrink material of the present invention is coated over the patterned photoresist and reacted with the photoresist. The thickness of the shrink layer can range from about 50 nm to about 500 nm, preferably 50 nm to 300 nm and more preferably 100 nm to 250 nm. The reaction between the shrink coating material and the photoresist to form the interface layer typically occurs during a heating step. The substrate may be heated between 80° C. and 200° C., preferably 90° C. and 190° C., and more preferably between 100° C. and 180° C. for 30 seconds to 180 seconds on a hotplate.

The residual portion of the shrink material that is not reacted to form the interface layer is removed using a removal solution. The removal solution may be water or comprises an aqueous solution of a surfactant, which may further comprise an alkali and/or a water-miscible solvent. Examples of an alkali are tetramethyl ammonium hydroxide, tetraethyl ammonium hydroxide, choline or mixtures thereof. Water-miscible solvents as also described previously are, for example, lower aliphatic alcohols such as ethanol or isopropanol; multifunctional alcohols such as ethylene glycol, propylene glycol, glycerol, or their monomethyl ethers, in particular propylene glycol monomethyl ether (PGME). Water-soluble nonionic surfactants and anionic surfactants were found to provide good lithographic results. Examples of nonionic surfactants are ethylene oxide/propylene oxide polymers, terminated by alkyl, fluoroalkyl, or aromatic groups. Anionic surfactants also gave superior lithographic performance, and examples of such surfactants are, salts of longer-chain alkanoic acids, such as laurates, stearates, or heptanoates, salts of alkyl or aralkyl sulfonic acids, such as laurylsulfonic acid, or variously substituted salts of sulfonic acid amides, or the partially or completely fluorinated derivatives of the above classes of compounds. Ammonium, tetramethyl ammonium, tetraethyl ammonium, or other alkyl ammonium ions are useful counter ions. The actual composition of the removal solution is dependent on factors such as, the shrink material, the desired lithographic performance, compatibility of materials, production specifications, etc.

The removal solution is applied on the surface of the substrate in a manner known in the art. Puddle development, immersion development, spray development or any mixtures of these techniques may be used to remove chemical compositions from the substrate. The time and temperature of the removal process is varied to give the best lithographic properties. Desirable lithographic properties being, for example, (a) cleanliness of the substrate after removal of the unreacted shrink material, that is, the substrate is free from insoluble deposits, stringers, bridges, etc, (b) vertical wall angles, and (c) smooth surfaces.

At current resolution targets it is desirable to obtain a space reduction of photoresist features obtained with the interface layer over the photoresist of between of from about 10 nm to about 60 nm, preferably about 20 nm to about 50 nm. The exact space width reduction requirement is highly dependent on the type of microelectronic devices being manufactured.

Once the desired narrow space is formed as defined by the process described above, the device may be further processed as required. Metals may be deposited in the space, the substrate may be etched, the photoresist may be planarized, etc.

Unless otherwise indicated, all numbers expressing quantities of ingredients, properties such as molecular weight, reaction conditions, and so forth used in the specification and claims are to be understood as being modified in all instances by the term "about." Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer, available from J.A.Woollam Co. Inc, (Lincoln, Nebr.).

The molecular weight of the polymers was measured on a Gel Permeation Chromatograph.

The defects were measured using KLA2360 (pixel size 0.25 μm (manufactured by KLA Tencor Co., San Jose, Calif.) in the exposed and unexposed areas after development.

Example 1

Synthesis of Poly(N-vinylpyrrolidone-co-N-vinylimidazole-co-N-vinylcaprolactam), poly(NVP/VI/VCL)

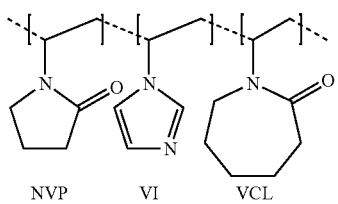

A series of poly(NVP-co-VI-co-VCL) terpolymers with different mole ratios were synthesized by free radical polymerization using AIBN as an initiator as shown in Table 1. As an example of the synthesis: 79.62 g (0.71 moles) of vinylpyrrolidone monomer was added drop wise in to the solution containing 33.71 g (0.35 moles) of N-vinylimidazole and 99.72 g (0.71 moles) of N-vinylcaprolactam in 455.0 g of isopropanol (IPA) as solvent. The initiator concentration was 15 wt % relative to the total weight of the monomers. After the addition, the reaction mixture was stirred for 30 minutes at 35° C. The polymerization reaction was carried out at 65° C. for 6 hrs. After the polymerization reaction, the solution was cooled and concentrated using rotary evaporator. The concentrated solution was precipitated in diethyl ether, diisopropyl ether and tertbutylmethyl ether. The amount of precipitating solvent used was 5 times that of the initial volume of reaction. The dried polymer was dissolved in a minimum amount of isopropylalcohol and precipitated in diethylether. The whole process was repeated 3 times to remove the unreacted monomers. The final copolymers were vacuum dried at 40° C. and the yield was 70%. The copolymers were characterized by NMR, GPC, and lithographic analysis.

The mole % of the monomers, N-vinylpyrrolidone (14-50%), N-vinyl imidazole (14-50%) and vinylcaprolactam (16-43%), for the different polymers is summarized in Table 1. The molecular weight (Mw) of the polymers were in the range of 23,000-38,000 and its polydispersity was in the range of 2.0-2.4. The solvents used were water and dimethylformamide (DMF).

TABLE 1

Polymerization Data: In feed mole ratios of the terpolymers (NVP/VI/VCL)

| Polymers | NVP (mol %) | VI (mol %) | VCL (mol %) |
|---|---|---|---|
| 1 | 33.3 | 33.3 | 33.3 |
| 2 | 20.0 | 40.0 | 40.0 |
| 3 | 14.3 | 42.9 | 42.9 |
| 4 | 40.0 | 40.0 | 20.0 |
| 5 | 28.6 | 28.6 | 42.9 |
| 6 | 33.3 | 50.0 | 16.7 |
| 7 | 42.9 | 14.3 | 42.9 |
| 8 | 50.0 | 33.3 | 16.7 |
| 9 | 37.5 | 37.5 | 25.0 |
| 10 | 40.0 | 20.0 | 40.0 |

NMR Data: $^1$H NMR spectra were recorded using $D_2O$ solvent. The methine proton resonances of imidazole ring appeared at δ 6.5-7.8 ppm. The methylene proton resonances of main chain (NVP, VI and VCL) and side chain of (NVP and VCL) appeared at δ 2.5-4.5 ppm. The methine proton resonances of main chain of (NVP, VI and VCL) appeared at δ 0.5-2.5. The assignments were done based on the homopolymer of individual monomeric unit in the polymer. The vinyl proton resonances of the monomers were not observed which indicates the polymers are pure and no unreacted monomers were present.

Example 2

Synthesis of Poly(N-vinylpyrrolidone-co-N-vinylcaprolactam), poly(NVP/VCL)

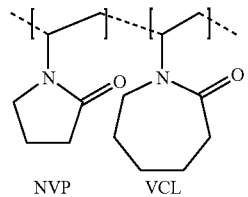

A series of poly(NVP-co-VCL) copolymers with different mole ratios was synthesized by free radical polymerization using AIBN as an initiator (Table 2). As an example of the synthetic process: 33.78 g (0.3 moles) of vinylpyrrolidone monomer was added dropwise into the solution containing 42.31 g (0.3 moles) of N-vinylcaprolactam in 162.50 g of isopropanol (IPA) as solvent. The initiator concentration was 15 wt % to the total weight of the monomers. After the addition, the reaction mixture was stirred for 30 minutes at 35° C. The reaction conditions and isolation process were the same as poly(NVP-co-VI-co-VCL) in Example 1.

TABLE 2

Polymerization Data: In feed mole ratios of the copolymers (NVP/VCL)

| Polymers | NVP (mol %) | VCL (mol %) |
|---|---|---|
| 11 | 90 | 10 |
| 12 | 80 | 20 |
| 13 | 70 | 30 |
| 14 | 60 | 40 |
| 15 | 50 | 50 |
| 16 | 40 | 60 |

The molecular weight (Mw) of the polymers were in the range of 23,000-38,000 and the polydispersity was in the range of 2.0-2.3. The solvents used were water and DMF.

Example 3

Synthesis of Poly(N-vinylimidazole-co-N-vinylcaprolactam), poly(VI/VCL)

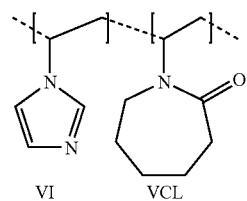

A series of poly(VI-co-VCL) copolymers with different mole ratios were synthesized by free radical polymerization using AIBN as an initiator (Table 3). As an example of the synthesis: 30.69 g (0.32 moles) of N-vinylimidazole monomer was added dropwise into the solution containing 45.39 g (0.32 moles) of N-vinylcaprolactam in 162.50 g of isopropanol (IPA) as solvent. The initiator concentration was 15 wt % of the total weight of the monomers. After the addition, the reaction mixture was stirred for 30 minutes at 35° C. The reaction conditions and isolation process were the same as poly(NVP-co-VI-co-VCL) in Example 1.

TABLE 3

Polymerization Data: In feed mole ratios of the copolymers (VI/VCL)

| Polymers | VI (mol %) | VCL (mol %) |
| --- | --- | --- |
| 17 | 40 | 60 |
| 18 | 50 | 50 |
| 19 | 60 | 40 |

The molecular weight (Mw) of the polymers were in the range of 23,000-38,000 and the polydispersity was in the range of 2.0-2.3. The solvents used were water and DMF.

Example 4 (a)

poly(NVP-co-VI-co-VCL) on KrF Photoresist, DX5250P: Mixing Bake Temperature Variation for (180 nm C/H with 480 nm Pitch)

An anti-reflective coating material, AZ® KrF-17B (manufactured by AZEM USA Corps, 70, Meister Ave., Somerville, N.J.) was spin coated on a silicon substrate and baked at 180° C. for 60 s to prepare an anti-reflective coating of 0.08 µm in thickness. Then AZ® DX5250P photoresist solution (manufactured by AZEM USA Corps, 70, Meister Ave., Somerville, N.J.) was spin-coated on the bottom anti-reflective coated (B.A.R.C) silicon substrate. The photoresist film was baked at 110° C. for 60 seconds to give a thickness of 0.45 µm. Then the photoresist film was exposed by KrF excimer laser exposure equipment of wavelength 248 nm. After exposure, the wafer was post-exposure baked at 110° C. for 60 sec. and developed using AZ®300 MIF (manufactured by AZEM USA Corps, 70, Meister Ave., Somerville, N.J.), a 2.38 wt % aqueous solution of tetramethylammonium hydroxide solution for 60 sec., to form a contact hole pattern having a diameter of 180 nm with 480 nm pitch (pitch is the distance between the start of the one hole and the start of the second hole). The photoresist patterns were then observed on a scanning electron microscope.

A mixture of 41.52 g of poly(N-vinylpyrrolidone-co-N-vinylimidazole-co-N-vinyl caprolactam) Polymer 10 from Example 1, 10.47 g of 2(2-aminoethylamino)ethanol and 0.37 g of surfactant S-485 (manufactured by Air Products & Chemicals, Inc. Allentown, Pa.) were dissolved in 947.63 g of DI water to prepare a shrink material composition. The solution was filtered using 0.2 µm filter. The total solid content in the formulation was 5%.

The above described shrink material composition or RELACS (Resolution Enhancement Lithography Assisted by Chemical Shrink) material was applied onto the previously photoresist patterned substrate and the thickness of the RELACS or shrink film was 200 nm. The substrate was subjected to heat treatment (i.e. mixing bake) at 150° C. for 60 seconds. Subsequently, the unreacted shrink material was removed using DI water puddle for 60 s and rinse for 30 s. The mixing bake temperature was varied from 120° C.-160° C. for 60 s in order to promote a crosslinking reaction at the interface between the photoresist and RELACS layer and the additive concentration was kept constant. Shrinkage is a measure of critical dimension (CD) difference of the contact hole (C/H) or trench before and after the RELACS process. The thicker the interface layer the greater the shrinkage, and a larger shrinkage is more desirable. Shrinkage was measured using CD-SEM. The diameter of the hole in the photoresist/RELACS was reduced by up to 40 nm from its initial hole diameter in the photoresist pattern. It was found that there is a change in the shrinkage (35 nm-40 nm) when bake temperature was varied from 120° C.-160° C. and data is summarized in Table 4.

Example 4 (b)

poly(NVP-co-VI-co-VCL) on ArF Resist, AX2050P: Mixing Bake Temperature Variation for (100 nm Trench with 200 nm Pitch)

An anti-reflective coating material, AZ® ArF-1C5D (manufactured by AZEM USA Corps, 70, Meister Ave., Somerville, N.J.) was spin coated on a silicon substrate and baked at 200° C. for 60 s to prepare an anti-reflective coating of 0.037 µm in thickness. Then AZ® AX2050P photoresist solution (manufactured by AZEM USA Corps, 70, Meister Ave., Somerville, N.J.) was spin-coated on the bottom anti-reflective coated (B.A.R.C) silicon substrate. The photoresist film was baked at 100° C. for 60 s to give a thickness of 0.17 µm. Then the photoresist film was exposed on a 193 nm scanner (numerical aperture of 0.78 and coherence of 0.9) using a 6% attenuated phase shift mask. After exposure, the wafer was post-exposure baked at 100° C. for 60 sec. and developed using AZ 626 MIF (manufactured by AZEM USA Corps, 70, Meister Ave., Somerville, N.J.) for 30 sec. followed by DI water rinse for 30 sec. to form a trench pattern size of 100 nm with 200 nm pitch.

The shrink coating material of Example 4 (a) was applied over the photoresist patterned substrate and subjected to heat treatment (i.e. mixing bake) at 150° C. for 60 s. Subsequently, the over-coating agent was removed using DI water puddle for 60 s and rinse for 30 s. The remaining process condition was identical to that of Example 4 (a). Shrinkage was measured using CD-SEM. CD size of trench pattern was reduced by up to 22 nm from the initial size of trench pattern. It was found that there is change in the shrinkage (19 nm-22 nm) when bake temperature was varied from 120° C.-160° C. and data is summarized in Table 4.

Example 4 (c)

poly(NVP-co-VI-co-VCL) on ArF Resist, AX2050P: Mixing Bake Temperature Variation for (90 nm C/H with 180 nm Pitch)

An anti-reflective coating material, AZ® ArF-1C5D (manufactured by AZEM USA Corps, 70, Meister Ave., Somerville, N.J.) was spin coated on silicon substrate and baked at 200° C. for 60 s to prepare an anti-reflective coating of 0.037 μm in thickness. Then AZ® AX2050P photoresist solution was spin-coated on the bottom anti-reflective coated (B.A.R.C) silicon substrate. The photoresist film was baked at 110° C. for 60 s to give a film thickness of 0.15 μm. Then the photoresist film was exposed on a 193 nm scanner (numerical aperture of 0.78 and coherence of 0.9) using a 6% attenuated phase shift mask. After exposure, the wafer was post-exposure baked at 110° C. for 60 sec. and developed using AZ® 626 MIF Developer (manufactured by AZEM USA Corps, 70, Meister Ave., Somerville, N.J.) for 30 sec. followed by DI water rinse for 30 sec. to form a contact hole photoresist pattern having a diameter of 90 nm with 180 nm pitch.

The shrink coating material of Example 4 (a) was applied over the photoresist patterned substrate and subjected to heat treatment (i.e. mixing bake) at 150° C. for 60 s. Subsequently, the shrink coating material was removed using DI water puddle for 60 s and rinse for 30 s. The remaining process condition was identical to that of Example 4 (a). The diameter of photoresist hole pattern was reduced by up to 32 nm by the use of the shrink material or RELACS material. It was found that there is no change in the shrinkage when bake temperature was varied from 120° C.-160° C. and is summarized in Table 4.

Example 4 (d)

poly(NVP-co-VI-co-VCL) on ArF Resist, AX2110P: Mixing Bake Temperature Variation for (70 nm Trench with 140 nm Pitch)

An anti-reflective coating material, AZ® ArF38 (manufactured by AZEM USA Corps, 70, Meister Ave., Somerville, N.J.) was spin coated on silicon substrate and baked at 225° C. for 90 s to prepare an anti-reflective coating of 0.087 μm in thickness. Then AZ® AX2110P photoresist solution (manufactured by AZEM USA Corps, 70, Meister Ave., Somerville, N.J.) was spin-coated on the bottom anti-reflective coated (B.A.R.C) silicon substrate. The photoresist film was baked at 100° C. for 60 s to prepare thickness of 0.12 μm. Then the photoresist film was exposed on a 193 nm scanner (numerical aperture of 0.78 and coherence of 0.9) using a 6% attenuated phase shift mask. After exposure, the wafer was post-exposure baked at 110° C. for 60 sec. and developed using AZ®300 MIF (manufactured by AZEM USA Corps, 70, Meister Ave., Somerville, N.J.) for 30 sec. followed by DI water rinse for 30 sec. to form a trench pattern size of 70 nm with 140 nm pitch.

The shrink coating material from Example 4(a) was applied over the photoresist patterned substrate and subjected to heat treatment (i.e. mixing bake) at 150° C. for 60 s. Subsequently, the shrink coating material was removed using DI water puddle for 60 s and rinse for 30 s. The remaining process condition was identical to that of Example 4 (a). Shrinkage was measured using COD-SEM. CD size of trench pattern was reduced up to 17 nm from the initial size of the photoresist trench pattern. It was found that there is change in the shrinkage (13 nm-17 nm) when bake temperature was varied from 120° C.-160° C. and data is summarized in Table 4.

Example 4 (e)

Poly(NVP-co-VI-co-VCL) on ArF Photoresist, A®AX1120P: Mixing Bake Temperature Variation for (100 nm Trench with 200 nm Pitch)

An anti-reflective coating material, AZ® ArF-1C5D (manufactured by AZEM USA Corps, 70, Meister Ave., Somerville, N.J.) was spin coated on silicon substrate and baked at 200° C. for 60 s to prepare an anti-reflective coating of 0.037 μm in thickness. Then AZ AX2050P photoresist solution (manufactured by AZEM USA Corps, 70, Meister Ave., Somerville, N.J.) was spin-coated on the bottom anti-reflective coated (B.A.R.C) silicon substrate. The photoresist film was baked at 120° C. for 60 s to prepare thickness of 0.17 μm. Then the photoresist film was exposed on a 193 nm scanner (numerical aperture of 0.78 and coherence of 0.9) using a 6% attenuated phase shift mask. After exposure, the wafer was post-exposure baked at 120° C. for 60 sec. and developed using AZ 300 MIF (manufactured by AZEM USA Corps, 70, Meister Ave., Somerville, N.J.) for 60 sec. followed by DI water rinse for 30 sec. to form a photoresist trench pattern of 100 nm with 200 nm pitch.

The shrink coating material from Example 4 (a) was applied on the photoresist patterned substrate and subjected to heat treatment (i.e. mixing bake) at 150° C. for 60 s. Subsequently, the shrink material was removed using DI water puddle for 60 s and rinse for 30 s. The remaining process condition was identical to that of Example 4 (a). Shrinkage was measured using CD-SEM. CD size of trench pattern was reduced by up to 12 nm from the initial size of trench pattern. It was found that there is change in the shrinkage (7 nm-12 nm) when bake temperature was varied from 120° C.-160° C. and data is summarized in Table 4.

TABLE 4

Shrinkage of the contact hole and trench

| Example/ Pattern Size | Substrates | Additive EA* (%) | CD (nm) | Mix Bake Temp (° C./60 s) | Film Thickness (nm) Resist | Film Thickness (nm) Relacs | Shrinkage (nm) |
|---|---|---|---|---|---|---|---|
| Example 4a | DX5250P | — | 182.4 | — | 450 | — | — |
| 180 nm | DX5250P + R* | 25 | 146.5 | 120 | 450 | 200 | 35.9 |
| C/H, | DX5250P + R* | 25 | 146.4 | 130 | 450 | 200 | 36.0 |
| 480 nm | DX5250P + R* | 25 | 145.7 | 140 | 450 | 200 | 36.7 |

TABLE 4-continued

Shrinkage of the contact hole and trench

| Example/ Pattern Size | Substrates | Additive EA* (%) | CD (nm) | Mix Bake Temp (° C./60 s) | Film Thickness (nm) Resist | Film Thickness (nm) Relacs | Shrinkage (nm) |
|---|---|---|---|---|---|---|---|
| pitch | DX5250P + R* | 25 | 143.1 | 150 | 450 | 200 | 39.3 |
|  | DX5250P + R* | 25 | 142.3 | 160 | 450 | 200 | 40.1 |
| Example 4b |  AX2050P | — | 102.7 | — | 170 | — | — |
| 100 nm | AX2050P + R* | 25 | 83.1 | 120 | 170 | 200 | 19.6 |
| Trench, | AX2050P + R* | 25 | 83.7 | 130 | 170 | 200 | 19.0 |
| 200 nm | AX2050P + R* | 25 | 83.9 | 140 | 170 | 200 | 18.8 |
| pitch | AX2050P + R* | 25 | 80.6 | 150 | 170 | 200 | 22.1 |
|  | AX2050P + R* | 25 | 82.8 | 160 | 170 | 200 | 19.9 |
| Example 4c | AX2050P | — | 93.4 | — | 150 | — | — |
| 90 nm C/H, | AX2050P + R* | 25 | 62.8 | 120 | 150 | 200 | 30.6 |
| 180 nm | AX2050P + R* | 25 | 63.0 | 130 | 150 | 200 | 30.4 |
| pitch | AX2050P + R* | 25 | 61.6 | 140 | 150 | 200 | 31.8 |
|  | AX2050P + R* | 25 | 62.1 | 150 | 150 | 200 | 31.3 |
|  | AX2050P + R* | 25 | 62.3 | 160 | 150 | 200 | 31.1 |
| Example 4d | AX2110P | — | 71.8 | — | 120 | — | — |
| 70 nm | AX2110P + R* | 25 | 58.3 | 120 | 120 | 120 | 13.5 |
| Trench, | AX2110P + R* | 25 | 58.5 | 130 | 120 | 120 | 13.3 |
| 140 nm | AX2110P + R* | 25 | 57.8 | 140 | 120 | 120 | 14.0 |
| pitch | AX2110P + R* | 25 | 57.5 | 150 | 120 | 120 | 14.3 |
|  | AX2110P + R* | 25 | 55.4 | 160 | 120 | 120 | 16.4 |
| Example 4e | AX1120P | — | 103.8 | — | 170 | — | — |
| 100 nm | AX1120P + R* | 25 | 96.6 | 120 | 170 | 200 | 7.2 |
| Trench, | AX1120P + R* | 25 | 95.4 | 130 | 170 | 200 | 8.4 |
| 200 nm | AX1120P + R* | 25 | 94.3 | 140 | 170 | 200 | 9.5 |
| pitch | AX1120P + R* | 25 | 92.2 | 150 | 170 | 200 | 11.6 |
|  | AX1120P + R* | 25 | 94.2 | 160 | 170 | 200 | 9.6 |

R* = RELACS
EA* = Ethanolamine
C/H = Contact Hole
CD = Critical Dimension
Shrinkage is the reduction in the space after forming the interface layer from the shrink material.

Example 4 (f)

Poly(NVP-co-VI-co-VCL) with 0, 5, 15, and 25 Weight % Additive on KrF Photoresist, AZ® DX5250P for (180 nm C/H with 480 nm Pitch)

A mixture of 49.3 g of poly(N-vinylpyrrolidone-co-N-vinylimidazole-co-N-vinyl caprolactam) Polymer 10 from Example 1, 2.61 g of 2(2-aminoethylamino)ethanol (Additive) and 0.37 g of surfactant (S-485) were dissolved in 947.63 g of DI water to prepare a shrink coating material. The process of Example 4 (a) was followed, except the shrink material of the present Example was used. The diameter of hole pattern was reduced by up to 50.6 nm from the initial diameter of photoresist hole pattern and the data is summarized in Table 5. The weight % of the Additive was varied with 0, 5, 15, 25 weight % of the Additive.

Example 4 (g)

Poly(NVP-co-VI-co-VCL) with 0, 5, 15, 25 Weight % Additive on ArF Photoresist, AX2050P for (100 nm Trench with 200 nm Pitch)

A mixture of 49.3 g of poly(N-vinylpyrrolidone-co-N-vinylimidazole-co-N-vinyl caprolactam), 2.61 g of 2(2-aminoethylamino)ethanol and 0.37 g of surfactant (S-485) were dissolved in 947.63 g of DI water to prepare shrink coating material. The process for Example 4 (a) was followed. The diameter of hole pattern was reduced by up to 20.1 nm from its initial diameter of hole pattern and the data is summarized in Table 5. The weight % of the Additive was varied with 0, 5, 15, 25 weight % of the Additive.

TABLE 5

Shrinkage for poly (N-vinylpyrrolidone-co-N-vinylimidazole-co-N-vinyl caprolactam) composition

| Pattern Size | Photoresist | Additive EA* (%) | CD (nm) | Mixing Bake Temperature (° C./60 s) | Film Thickness (nm) Resist | Film Thickness (nm) Relacs | Shrinkage (nm) |
|---|---|---|---|---|---|---|---|
| Example 4f | DX5250P | — | 184.7 | — | 450 | — | — |
| 180 nm C/H, | DX5250P + R* | 0 | 167.5 | 150 | 450 | 200 | 17.2 |
| 480 nm pitch | DX5250P + R* | 5 | 156.4 | 150 | 450 | 200 | 28.3 |
|  | DX5250P + R* | 15 | 141.5 | 150 | 450 | 200 | 43.2 |
|  | DX5250P + R* | 25 | 134.2 | 150 | 450 | 200 | 50.5 |

TABLE 5-continued

Shrinkage for poly (N-vinylpyrrolidone-co-N-vinylimidazole-co-N-vinyl caprolactam) composition

| Pattern Size | Photoresist | Additive | | Mixing Bake Temperature | Film Thickness (nm) | | Shrinkage (nm) |
| | | EA* (%) | CD (nm) | (° C./60 s) | Resist | Relacs | |
| --- | --- | --- | --- | --- | --- | --- | --- |
| Example 4g | AX2050P | — | 103.2 | — | 170 | — | — |
| 100 nm Trench, | AX2050P + R* | 0 | 90.4 | 150 | 170 | 200 | 12.8 |
| 200 nm pitch | AX2050P + R* | 5 | 90.4 | 150 | 170 | 200 | 12.8 |
| | AX2050P + R* | 15 | 85.9 | 150 | 170 | 200 | 17.3 |
| | AX2050P + R* | 25 | 83.1 | 150 | 170 | 200 | 20.1 |

R* = RELACS
EA* = Ethanolamine
C/H = Contact Hole
CD = Critical Dimension
Shrinkage is the reduction in the space after forming the interface layer from the shrink material.

Example 5

Shrinkage Performance of poly(NVP-co-VCL) on ArF Photoresist, AZ®AX2050P for (100 nm Trench with 200 nm Pitch)

An anti-reflective coating material, AZ®ArF-1C5D (manufactured by AZEM USA Corps, 70, Meister Ave., Somerville, N.J.) was spin coated onto a silicon substrate and baked at 200° C. for 60 s to prepare an anti-reflective coating of 0.037 μm in thickness. Then AZ®AX2050P photoresist solution was spin-coated on the bottom anti-reflective coated (B.A.R.C) silicon substrate. The photoresist film was baked at 100° C. for 60 s to give a thickness of 0.17 μm. Then the photoresist film was exposed on a 193 nm scanner exposure equipment (numerical aperture of 0.78 and coherence of 0.9) using a 6% attenuated phase shift mask. After exposure, the wafer was post-exposure baked at 100° C. for 60 sec. and developed using AZ®626 MIF (manufactured by AZEM USA Corps, 70, Meister Ave., Somerville, N.J.) for 30 sec. followed by DI water rinse for 30 sec. to form a photoresist trench pattern of 100 nm with 200 nm pitch.

38.9 g of poly(N-vinylpyrrolidone-co-N-vinyl caprolactam), 13.1 g of 2(2-aminoethylamino)ethanol and 0.37 g of surfactant (S-485) were dissolved in 947.63 g of DI water to prepare a shrink coating material. The shrink coating material was applied over the photoresist patterned substrate and subjected to heat treatment (i.e. mixing bake) at 150° C. for 60 s. Subsequently, the shrink coating material was removed using DI water puddle for 60 s and rinsed for 30 s. Shrinkage was measured using CD-SEM. The critical dimension of the photoresist/shrink material trench pattern space was reduced by up to 20 nm from the initial size of the photoresist trench pattern.

Example 6

Shrinkage Performance of poly(N-vinylimidazole-co-N-Vinyl caprolactam) on Photoresist Pattern A mixture of 29.0 g of poly(N-vinylimidazole-co-N-vinyl caprolactam), 7.33 g of 2(2-aminoethylamino)ethanol and 0.26 g of surfactant S485 were dissolved in 663.3 g of DI water to prepare an shrink material composition. The shrink coating material was applied over the KrF photoresist AZ® DX5250P contact hole patterned substrate and ArF photoresist AZ® AX2050P contact hole patterned substrate. The photoresist process and RELACS process were the same as Example 4a and Example 4b. The maximum shrinkage obtained was 20 nm.

Defect Inspection of poly(NVP-co-Vi-co-VCL) by KLA

Example 7 (a)

An anti-reflective coating material, AZ®KrF-17B (manufactured by AZEM USA Corps, 70, Meister Ave., Somerville, N.J.) was spin coated onto a silicon substrate and baked at 180° C. for 60 s to prepare an anti-reflective coating of 0.08 μm in thickness. Then AZ® DX5250P photoresist solution was spin-coated over the bottom anti-reflective coated (B.A.R.C) silicon substrate. The photoresist film was baked at 90° C. for 60 s to give a thickness of 0.41 μm. Then the photoresist film was exposed with a KrF excimer laser tool with a wavelength of 248 nm. After exposure, the wafer was post-exposure baked at 120° C. for 60 sec. and developed using AZ®300 MIF (manufactured by AZEM USA Corps, 70, Meister Ave., Somerville, N.J.), a 2.38 wt % aqueous solution of tetramethylammonium hydroxide solution for 60 sec., to form a contact hole pattern having a diameter of 160 nm with 480 nm pitch. The photoresist patterns were then observed on a scanning electron microscope (SEM).

41.52 g of poly(N-vinylpyrrolidone-co-N-vinylimidazole-co-N-vinyl caprolactam) Polymer 10 from Example 4, 10.47 g of 2(2-aminoethylamino)ethanol and 0.37 g of surfactant (S-485) were dissolved in 947.63 g of DI water to prepare shrink coating material. Then the shrink coating material was applied over the photoresist patterned substrate and the thickness of the shrink film was 200 nm and was subjected to heat treatment (i.e. mixing bake) at 150° C. for 60 s. Subsequently, the shrink material was removed using DI water puddle for 60 s and rinsed for 60 s. The defect measurement was done using KLA2360 (pixel size 0.25 μm (manufactured by KLA Tencor Co.) in the exposed and unexposed areas after development. The total defect number was 200 and no smudge defects were observed. A smudge defect is where the defect is not a particle but an elliptical smudge-like defect on the surface. The same process was followed for the comparative material, where the product AZ® R607 (manufactured by AZEM USA Corps, 70, Meister Ave., Somerville, N.J.) was used as the shrink material. The comparative example showed 90 smudge defects. The defect data is summarized in Table 6.

Example 7 (b)

The process of Example 7 (a) was repeated except the photoresist used was AZ® AX2050P. It was observed that both the total defects and the smudge defects of the present novel shrink material were low compared to AZ® R607 and the data is summarized in Table 6.

Example 7 (c)

The process of Example 7 (a) was repeated except the photoresist used was AZ® AX1120P. It was observed that both the total defects and the smudge defects of the present novel shrink material were low compared to AZ® R607 and the data is summarized in Table 3.

TABLE 6

Defect Comparison

| Example/ Pattern Size | Photoresist | Shrink Material | Number of Defect | | | |
|---|---|---|---|---|---|---|
| | | | Total | | Smudge | |
| | | | Exposed | Unexposed | Exposed | Unexposed |
| Example 7a 160 nm C/H, 480 nm pitch | AZ DX5250P (KrF) | Example 7a AZ R607 | 185 122 | 156 112 | 0 89 | 0 18 |
| Example 7b 100 nm C/H 200 nm pitch | AZ AX2050P (ArF) | Example 7b AZ R607 | 29 34 | 124 174 | 0 10 | 5 136 |
| Example 7c 120 nm Trench, 240 nm pitch | AZ AX1120P (ArF) | Example 7c AZ R607 | 90 627 | 362 721 | 4 134 | 0 22 |

The invention claimed is:

1. A process for manufacturing a microelectronic device, comprising;
    a) providing a substrate with a photoresist pattern;
    b) coating the photoresist pattern with an aqueous coating composition for coating a photoresist pattern, comprising a polymer comprising at least one lactam group, where the lactam group attached to the polymer has a structure (1),

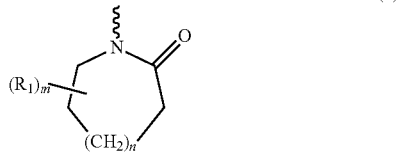

where $R_1$ is independently selected from hydrogen, $C_1$-$C_4$ alkyl, $C_1$-$C_6$ alkyl alcohol, hydroxy (OH), amine ($NH_2$), carboxylic acid, and amide ($CONH_2$), ～～ represents the attachment to the polymer, m=1-6, and n=1-4, further where the lactam group is present in the polymer in the range of 16-43 mole %;
    c) reacting a portion of the coating material in contact with the photoresist pattern;
    d) removing a portion of the coating material which is not reacted with a removal solution.

2. The process according to claim 1, where the substrate is heated to cause a reaction of the coating material with the photoresist image.

3. The process according to claim 1, where the removal solution is an aqueous solution comprising a hydroxide base.

4. The process according to claim 1, where the removal solution further comprises a water-miscible solvent.

5. The process of claim 1, where the composition further comprises a free acid selected from p-toluenesulphonic acid, perfluorobutanesulphonic acid, perfluorooctanesulphonic acid, (±) camphorsulphonic acid and dodecylbenzenesulphonic acid.

6. The process of claim 1, where n=2.

7. The process of claim 1, where the polymer containing the lactam group comprises a monomeric unit derived from vinyl caprolactam.

8. The process of claim 1, where the polymer containing the lactam group comprises at least one other comonomeric unit.

9. The process of claim 8, where the comonomeric unit is derived from monomers comprising groups selected from pyrrolidone, imidazole, amine, carboxylic acid, and amide.

10. The process of claim 8, where the comonomeric unit is derived from monomers selected from N-vinyl pyrrolidone, vinyl imidazole, allylamine, methacylic acid, acrylic acid, acrylamide, and N-alkyl acrylamide.

11. The process of claim 1, where the polymer is selected from poly(N-vinyl caprolactam-co-vinyl amine), poly(N-vinyl caprolactam-co-allyl amine), poly(N-vinyl caprolactam-co-diallyl amine), poly(N-vinyl caprolactam-co-acryloyl morpholine), poly(N-ylnyl caprolactam-co-2-dimethylaminoethyl methacrylate), poly(N-vinyl caprolactam-co-piperidinyl methacrylate), poly(N-vinyl caprolactam-co-N-methyl N-vinylacetamide) and poly(N-vinyl caprolactam-co-dimethylaminopropyl methacrylamide), poly(N-vinyl pyrrolidone-co-vinyl imidazole-co-N-vinyl-caprolactam), and poly(N-vinyl pyrrolidone-co-N-vinyl-caprolactam).

12. The process of claim 1, where the composition further contains a water miscible solvent.

13. The process of claim 1, where the composition further contains a water miscible solvent selected from ($C_1$-$C_8$)alcohols, diols, triols, ketones, esters, lactates, amides, ethylene glycol monoalkyl ethers, ethylene glycol monoalkyl ether acetate, N-methylpyrrolidone, propylene glycol monomethyl ether, propylene glycol monoethyl ether, propylene glycol monomethyl ether acetate, and propylene glycol monoethyl ether acetate.

14. The process of claim 1, where the composition further comprises additives selected from surfactant, aminoalcohol, amine, $C_1$-$C_8$ alcohol, photoacid generator, crosslinking compound, thermal acid generator, and free acid.

15. The process of claim 1, where the composition is free of a crosslinking compound.

16. The process of claim 1, where the composition is free of a photoacid generator.

* * * * *